(12) United States Patent
Shimanouchi et al.

(10) Patent No.: US 9,543,499 B2
(45) Date of Patent: Jan. 10, 2017

(54) POWER GENERATION DEVICE

(71) Applicant: FUJITSU LIMITED, Kawasaki-shi, Kanagawa (JP)

(72) Inventors: Takeaki Shimanouchi, Akashi (JP); Osamu Toyoda, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 15 days.

(21) Appl. No.: 14/540,291

(22) Filed: Nov. 13, 2014

(65) Prior Publication Data

US 2015/0115748 A1 Apr. 30, 2015

Related U.S. Application Data

(63) Continuation of application No. PCT/JP2012/065135, filed on Jun. 13, 2012.

(51) Int. Cl.
*H01L 41/12* (2006.01)
*H02N 2/18* (2006.01)

(52) U.S. Cl.
CPC ............ *H01L 41/125* (2013.01); *H02N 2/186* (2013.01)

(58) Field of Classification Search
CPC ............................. H01L 141/125; H02N 2/186
USPC .......................................................... 310/26
See application file for complete search history.

(56) References Cited

U.S. PATENT DOCUMENTS

| 4,845,450 | A | * | 7/1989 | Porzio | ................... | B06B 1/0618 |
|---|---|---|---|---|---|---|
| | | | | | | 310/26 |
| 5,850,109 | A | * | 12/1998 | Mock | .................... | F04B 17/003 |
| | | | | | | 310/26 |
| 6,249,064 | B1 | * | 6/2001 | Bradbury | ............. | G11B 5/5552 |
| | | | | | | 310/22 |
| 2006/0075824 | A1 | * | 4/2006 | Kishimoto | .............. | D06F 37/24 |
| | | | | | | 73/779 |
| 2013/0140919 | A1 | | 6/2013 | Ueno | | |

FOREIGN PATENT DOCUMENTS

| JP | 2004-346924 A1 | 12/2004 |
|---|---|---|
| JP | 4905820 B2 | 3/2012 |
| WO | WO 2011/158473 A1 | 12/2011 |

OTHER PUBLICATIONS

Office action dated Jul. 7, 2015, in counterpart JP Application No. 2014-521041, with partial translation.
International Search Report for International Application No. PCT/JP2012/065135 dated Sep. 4, 2012.

* cited by examiner

*Primary Examiner* — Terrance Kenerly
(74) *Attorney, Agent, or Firm* — Kratz, Quintos & Hanson, LLP (57) ABSTRACT

A power generation device includes: first and second beams which are arranged to face each other and are bent by vibration; and a coil wound around the first and second beams. Each of the first and second beams includes: a beam body; and a stress relaxation layer made of a material different from a material of the beam body and partially covering the surface of the beam body.

16 Claims, 9 Drawing Sheets

POWER GENERATION DEVICE

CROSS-REFERENCE TO RELATED APPLICATION

This application is a continuation of International Patent Application No. PCT/JP2012/065135 filed Jun. 13, 2012 and designated the U.S., the entire contents of which are incorporated herein by reference.

FIELD

The embodiments discussed herein are related to a power generation device.

BACKGROUND

In recent years, low-powered short-distance wireless communication techniques typified by ZigBee have been developed, and wireless sensor networks that employ such short-distance wireless communication techniques have been built. However, using batteries as power supplies in the wireless sensor networks leads to problems of the lifetime of batteries, environmental burdens due to battery disposal, and the like. Accordingly, attentions have been drawn to energy harvesting techniques which harvest various types of energy existing in the environment, such as heat, vibration, light, and radio waves and convert the energy into electricity.

One of the energy harvesting techniques having been proposed so far is a power generation device which includes a pair of beams made of a magnetostrictive material, a coil wound around each beam, and a magnet producing a magnetic flux. In this type of power generation device, the beams are bent by vibration, and the magnetic flux passing through the beams changes in density to induce current in the coils. The induced current is extracted from the coils and may be used as power for driving an electronic device.

Patent Literature 1: WO2011/158473

SUMMARY

According to an aspect of the technique of the disclosure, a power generation device is provided, which includes: first and second beams which are arranged to face each other and are bent by vibration; and a coil wound around the first and second beams. Each of the first and second beams includes: a beam body; and stress relaxation layers which are made of a material different from a material of the beam body and partially cover the surface of the beam body.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, a description is given of the prelude for facilitating understanding of embodiments before description of the embodiments.

Figure 1A:
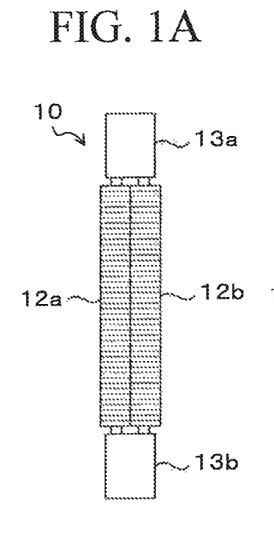
FIG. 1A is a front view illustrating an example of a power generation device.
Figure 1B:
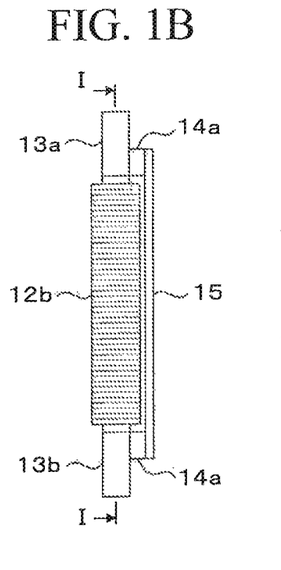
FIG. 1B is a side view thereof.
Figure 1C:
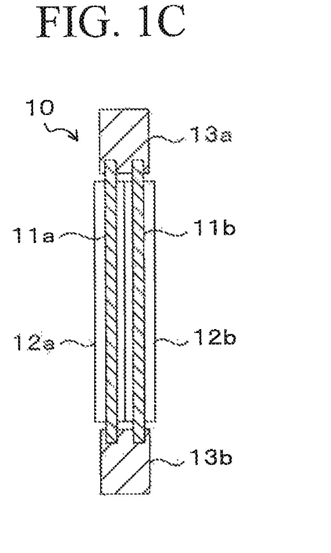
FIG. 1C is a cross-sectional view taken along a line I-I of FIG. 1B.

FIG. 1A is a front view illustrating an example of a power generation device, FIG. 1B is a side view thereof, and FIG. 1C is a cross-sectional view taken along a line I-I of FIG. 1B.

A power generation device 10 illustrated in FIGS. 1A to 1C includes beams 11a and 11b, coils 12a and 12b, joint yokes 13a and 13b, permanent magnets 14a and 14b, and a back yoke 15.

Each of the beams 11a and 11b is a long thin plate made of a magnetostrictive material. These beams 11a and 11b are arranged to face each other and are wound with coils 12a and 12b, respectively. Moreover, upper portions of the beams 11a and 11b are joined to each other through the joint yoke 13a, and lower portions of the beams 11a and 11b are joined to each other through the joint yoke 13b.

Ends of the beams 11a and 11b on the joint yoke 13a side are connected to a north pole of the magnet 14a, and ends thereof on the joint yoke 13b side are connected to a south pole of the magnet 14b. The back yoke 15 is made of a magnetic material mainly containing iron and magnetically connects the south pole of the magnet 14a and the north pole of the magnet 14b. Flux paths passing through sequentially the magnet 14a, beams 11a and 11b, magnet 14b, and back yoke 15 are thereby formed.

Figure 2:
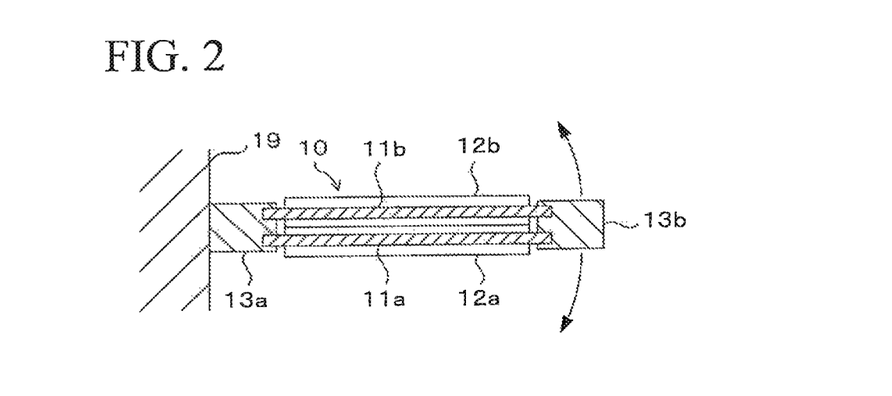
FIG. 2 is a schematic view illustrating the power generation device attached to a support.

In the thus-configured power generation device 10, any one of the joint yokes 13a and 13b is fixed to a support. Herein, as illustrated in FIG. 2, the joint yoke 13a is fixed to a support 19, and the joint yoke 13b is free. Generally, the end fixed to a support is called a fixed end, and the other end is called a movable end.

When vibration is applied to the power generation device 10, the beams 11a and 11b bend in response to the vibration, and the magnetic flux passing through the beams 11a and 11b changes in density. Accordingly, electric current flows in the coils 12a and 12b in accordance with the change in magnetic flux density. The generated current is extracted from the coils 12a and 12b and may be used as power for driving electronic equipment.

However, the power generation efficiency of the aforementioned power generation device is not high enough. The reasons therefor are described below.

In the power generation device 10 illustrated in FIGS. 1A to 1C, two beams 11a and 11b are arranged in parallel to each other, and the upper portions of the beams 11a and 11b are connected to the joint yoke 13a, and the lower portions of the beams 11a and 11b are connected to the joint yoke 13b. Accordingly, when the support vibrates, the beams 11a and 11b individually bend into an S shape as schematically illustrated in FIG. 3.

Figure 3:
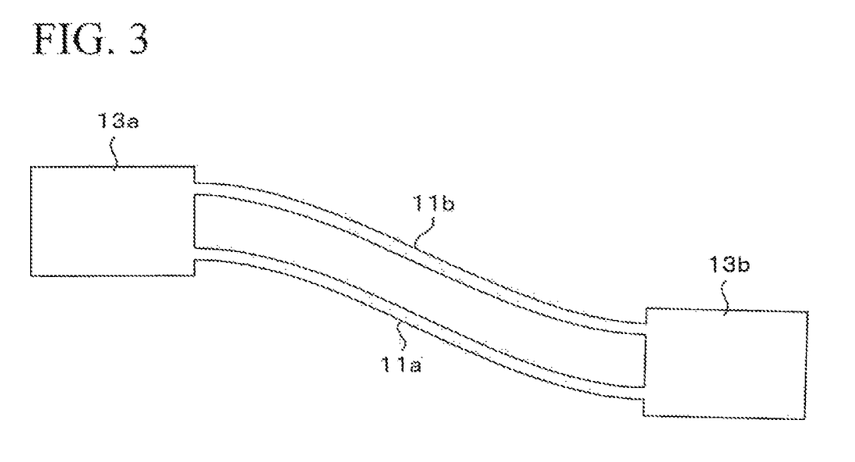
FIG. 3 is a view illustrating bent beams of the power generation device.
Figure 4:
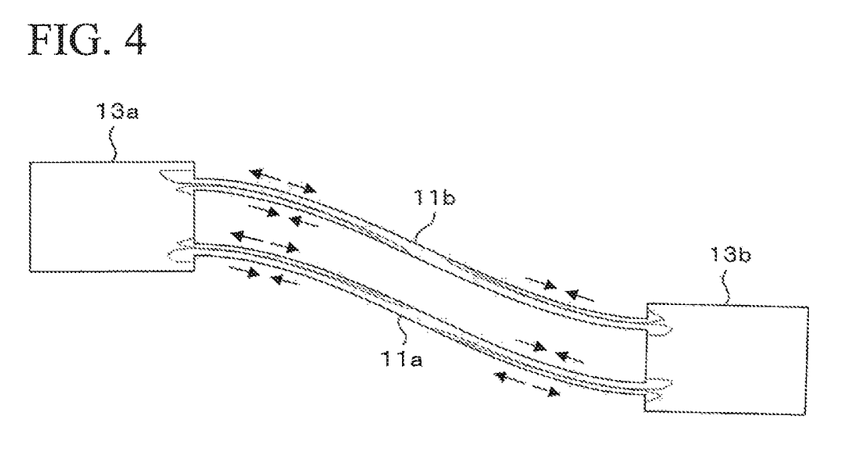
FIG. 4 is a view illustrating a result of simulation for a distribution of stress in the bent beams.

FIG. 4 is a view illustrating a result of simulation for a distribution of stress in the beams 11a and 11b that have bent as illustrated in FIG. 3.

When the beams 11a and 11b are bent into an S shape, in the joint yoke 13a side, one surface side (the upper side in FIG. 4) of each beam 11a, 11b is subjected to large tensile stress, and the other surface side (the lower side in FIG. 4) is subjected to large compressive stress. Moreover, in the joint yoke 13b side, one surface side (the upper side in FIG. 4) of each beam 11a, 11b is subjected to large compressive stress, and the other surface side (the lower side in FIG. 4) is subjected to large tensile stress.

When the tensile stress and compressive stress simultaneously develop in the one surface side and the other surface side of each beam 11a, 11b, which is formed into a thin plate, the change in magnetic flux density in one surface side of each beam 11a, 11b is cancelled by the change in magnetic flux density in the other surface side. Accordingly, the beams 11a and 11b do not produce enough electromotive force near the joint yokes 13a and 13b and produce enough electromotive force in central part of the beams 11a and 11b. The power generation device 10 illustrated in FIGS. 1A to 1C therefore does not generate power with high enough efficiency.

In the following embodiments, a description is given of power generation devices generating power with high efficiency.

Figure 5A:
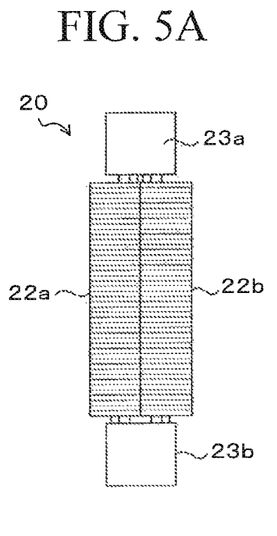
FIG. 5A is a front view illustrating a power generation device according to a first embodiment.
Figure 5B:
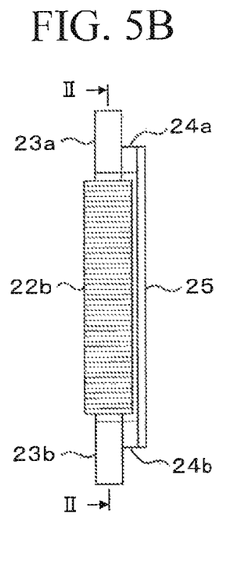
FIG. 5B is a side view thereof.
Figure 5C:
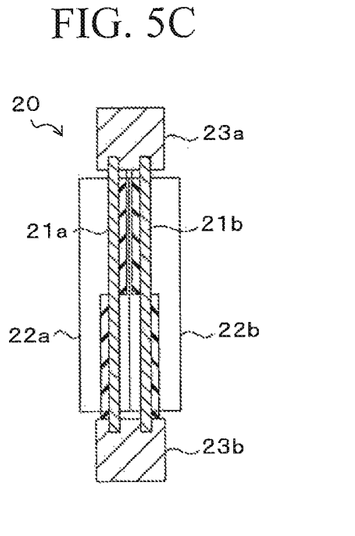
FIG. 5C is a cross-sectional view taken along a line II-II of FIG. 5B.
Figure 6:
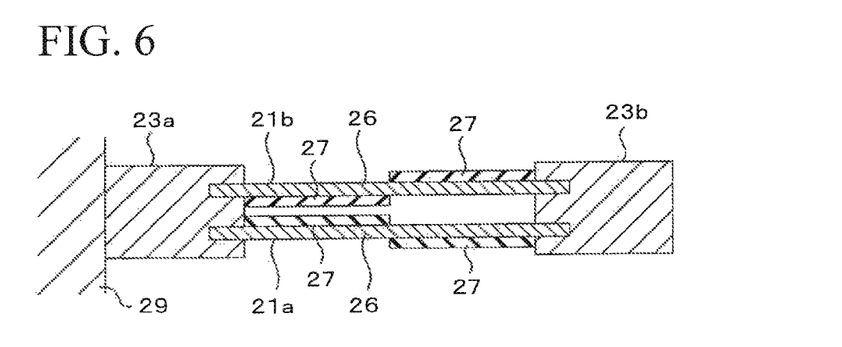
FIG. 6 is a cross-sectional view illustrating beams of the power generation device according to the first embodiment.

First Embodiment FIG. 5A is a front view illustrating a power generation device according to a first embodiment, FIG. 5B is a side view thereof, and FIG. 5C is a cross-sectional view taken along a line II-II of FIG. 5B. FIG. 6 is a cross-sectional view illustrating beams of the power generation device according to the first embodiment.

A power generation device 20 according to the first embodiment includes beams 21a and 21b, coils 22a and 22b, joint yokes 23a and 23b, permanent magnet 24a and 24b, and a back yoke 25.

As illustrated in FIG. 6, each of the beams 21a and 21b includes: a beam body 26 which is a long thin plate made of a magnetostrictive material; and stress relaxation layers 27 which are made of a non-magnetic material and partially cover the surface of the beam body 26. In the first embodiment, in portions of the beams 21a and 21b on the joint yoke 23a side, the stress relaxation layers 27 are formed on the surfaces of the beam bodies 26 facing each other. In portions of the beams 21a and 21b on the joint yoke 23b side, the stress relaxation layers 27 are formed on the surfaces of the beam bodies 26 opposite to the surfaces facing each other. The beam bodies 26 and stress relaxation layers 27 are described in detail later.

The beams 21a and 21b are arranged to face each other. It is assumed that the gap between the beams 21a and 21b is 1 mm in the first embodiment. The beams 21a and 21b are wound with the coils 22a and 22b, respectively. The upper portions of the beams 21a and 21b are joined by the joint yoke 23a, and the lower portions of the beams 21a and 21b are joined by the joint yoke 23b.

The ends of the beams 21a and 21b on the joint yoke 23a side are connected to the north pole of the magnet 24a, and the ends thereof on the joint yoke 23b side are connected to the south pole of the magnet 24b.

The back yoke 25 is made of a magnetic material and connects the south pole of the magnet 24a and the north pole of the magnet 24b, thus forming a flux path sequentially passing through the magnet 24a, beams 21a and 21b, magnet 24b, and back yoke 25.

As described above, the beam bodies 26 are made of a magnetostrictive material. In the first embodiment, each beam body 26 is a 8.2 mm long, 1 mm wide, and 0.2 mm thick thin plate made of an iron-gallium alloy.

The beam bodies 26 may be made of another magnetostrictive material, such as an iron-cobalt alloy, a Fe—Co base amorphous material, a Fe-based amorphous material, or a Ni-based amorphous material, for example. The Fe—Co base amorphous material may be Co—Fe—Ni—Mo—B—Si, Co—Fe—Ni—B—Si, or the like, for example. The Fe based amorphous material is Fe—B—Si, Fe—B—Si—Cr, Fe—Ni—Mo—B, or the like, for example. The Ni-based amorphous material is Ni—Cr—Fe—Si—B, Ni—Si—B, Ni—Cr—Si—B, or the like, for example.

The stress relaxation layers 27 are made of a non-magnetic material as described above. In the first embodiment, each stress relaxation layer 27 is made of silicon oxide ($SiO_2$) and has a thickness of 0.2 mm.

The stress relaxation layers 27 may be made of a non-magnetic metal such as aluminum or copper. However, when the stress relaxation layers 27 are made of a non-magnetic metal, eddy currents might be generated in the beams 21a and 21b which are bent, thus reducing the power generation efficiency. Accordingly, the stress relaxation layers 27 are preferably made of an insulating material.

When the stress relaxation layers 27 are made of an insulating material having high toughness, such as polyimide, polycarbonate, or fiber-reinforced plastic, the beams 21a and 21b are less likely to be broken even if repeatedly bent. In the process of using polyimide, polycarbonate, fiber-reinforced plastic, or the like to form the stress relaxation layers 27, these materials are formed into a sheet and are thermocompression bonded or bonded with an adhesive to the beam bodies 26.

The stress relaxation layers 27 may be made of an inorganic material such as $SiO_2$ or alumina. Inorganic materials including $SiO_2$ and alumina have higher Young's modulus than organic materials such as polyimide and polycarbonate. Accordingly, even if made thin, the stress relaxation layers 27 made of an inorganic material may provide the same effects.

The natural frequencies of the beams 21a and 21b depend on the length, the Young's modulus, the weight of the joint yoke 23b on the movable end side of the beams 21a and 21b. Preferably, the length, the Young's modulus, the weight of the joint yoke 23b on the movable end side of the beams 21a and 21b are adjusted in accordance with vibration applied to the power generation device 20. The stress relaxation layers 27 may be made thinner when made of a material having a higher Young's modulus.

In the power generation device 20 according to the first embodiment, the joint yoke 23a is fixed to the support 29 as illustrated in FIG. 6, for example. When the power generation device 20 is vibrated, the beams 21a and 21b bend in response to the vibration, and the magnetic flux passing through the beams 21a and 21b changes in density. Therefore, electric current flows in the coils 22a and 22b in accordance with the change in magnetic flux density. The generated current is extracted from the coils 22a and 22b and may be used as power for driving electronic equipment.

Figure 7:
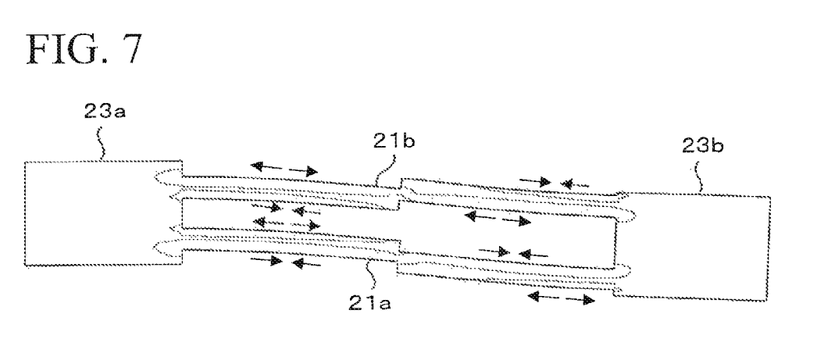
FIG. 7 is a view illustrating a result of simulation for a distribution of stress when the beams of the power generation device according to the first embodiment bend into an S shape.

FIG. 7 is a view illustrating a result of simulation for a distribution of stress when the beams 21a and 21b bend into an S shape.

When the beams 21a and 21b are bent into an S shape as illustrated in FIG. 7, in the joint yoke 23a side, one surface side (the upper side in FIG. 7) of each beam 21a, 21b is subjected to large tensile stress while the other surface side (the lower side in FIG. 7) is subjected to large compressive stress. In the joint yoke 23b side, one surface side (the upper side in FIG. 7) of each beam 21a, 21b is subjected to large compressive stress while the other surface side (the lower side in FIG. 7) is subjected to large tensile stress.

However, as may be seen from FIG. 7, in the joint yoke 23a side of each beam 21a, 21b, the beam bodies 26 are mainly subjected to tensile stress, and the stress relaxation layers 27 are mainly subjected to compressive stress. In the joint yoke 23b side of the beams 21a and 21b, the beam bodies 26 are mainly subjected to tensile stress, and the stress relaxation layers 27 are mainly subjected to compressive stress.

In other words, in the power generation device 20 according to the first embodiment, when the beams 21a and 21b are bent as illustrated in FIG. 7, tensile stress develops substantially throughout the beam bodies 26, which are made of a magnetostrictive material, in the thickness and length directions. When the beams 21a and 21b are bent in the direction opposite to the direction illustrated in FIG. 7, compressive stress develops substantially throughout the beam bodies 26 in the thickness and length directions.

As described above, in the power generation device 20 according to the first embodiment, tensile or compressive stress develops substantially throughout the beam bodies 26, which are made of a magnetostrictive material, in the thickness and length directions. Accordingly, the power generation device 20 generates power with high efficiency. It may be therefore possible to extract large power from the power generation device 20 according to the first embodiment with small vibration.

Figure 8A:
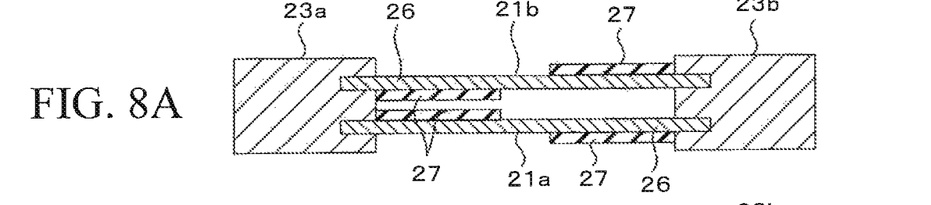
FIGS. 8A, 8B and 8C are views illustrating a modification of the first embodiment (No. 1)
Figure 8B:
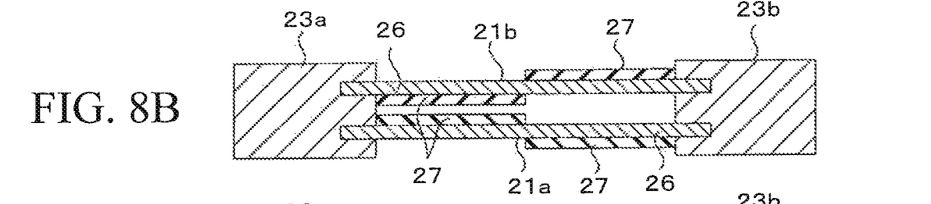

(Modification) In the first embodiment, each stress relaxation layer 27 is provided on the inner side of the corresponding beam body 26 in a range from the center of the beam body 26 to the joint yoke 23a as illustrated in FIG. 8B. Each stress relaxation layer 27 is provided on the outer side of the corresponding beam body 26 in a range from the center of the beam body 26 to the joint yoke 23b.

Figure 8C:
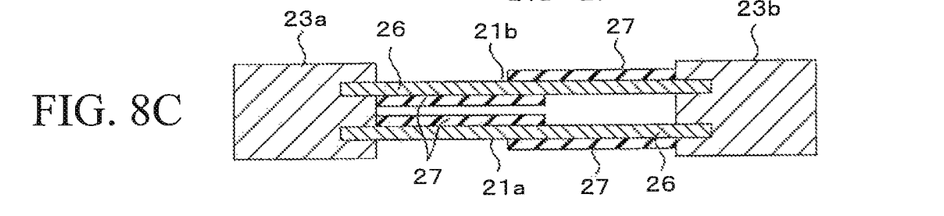

However, the stress relaxation layers 27 do not need to be formed in central portions of the beams 21a and 22b as illustrated in FIG. 8A. Moreover, as illustrated in FIG. 8C, the stress relaxation layer 27 formed on one surface of each beam 21a, 21b and the stress relaxation layer 27 formed on the other surface of the same may face each other with the beam body 26 interposed therebetween in the central portions of the beams 21a and 22b. When the range where the stress relaxation layers 27 are formed is changed as illustrated in FIGS. 8A to 8C, the spring constants of the beams 21a and 21b change, and the natural frequency of the power generation device 20 therefore changes.

Figure 9:
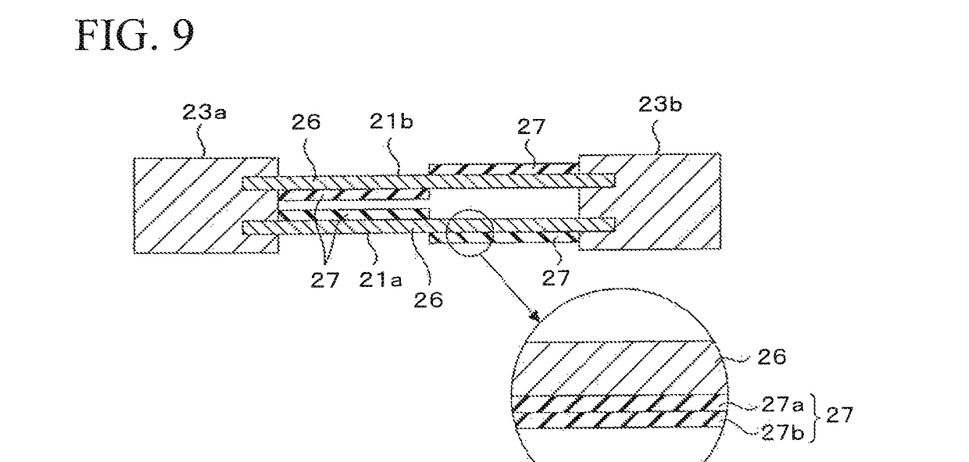
FIG. 9 is a view illustrating another modification of the first embodiment (No. 2)

As illustrated in FIG. 9, each stress relaxation layer 27 may be composed of plural layers 27a and 27b made of different materials. The distributions of compressive and tensile stresses developing in the beams 21a and 21b change depending on the materials and thicknesses of the layers 27a and 27b forming each stress relaxation layer 27.

Figure 10:
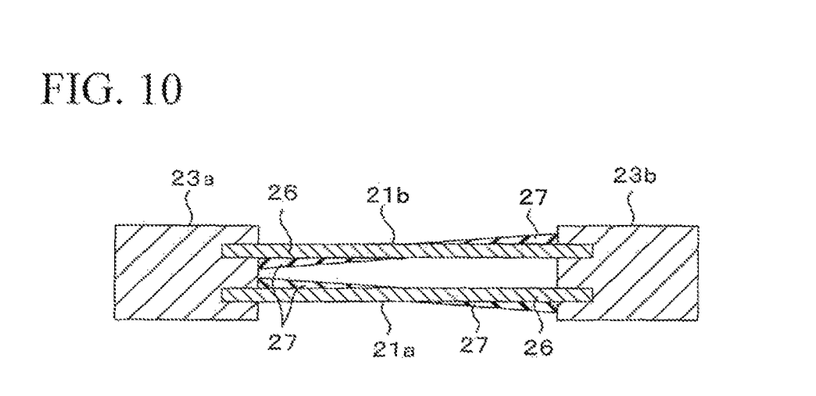
FIG. 10 is a view illustrating still another modification of the first embodiment (No. 3)

Furthermore, as may be seen from FIG. 7, the compressive stress developing in the stress relaxation layers 27 is high near the joint yokes 23a and 23b and is low in the centers of the beams 21a and 21b. Accordingly, the stress relaxation layers 27 may be made thick near the joint yokes 23a and 23b and made thin in the centers of the beams 21a and 21b as illustrated in FIG. 10. The spring constant of each beam body 26 changes when the stress relaxation layers 27 are attached to the beam body 26. However, the change in the spring constant may be reduced by changing the thickness of each stress relaxation layer 27 in the length direction of the beam body 26.

Furthermore, the stress relaxation layers 27 may be formed any one of the inner and outer sides of the beams 21a and 21b. The power generation efficiency of the thus-configured power generation device is lower than that of the power generation device 20 illustrated in FIGS. 5 and 6 but is higher than that of the power generation device 10 illustrated in FIG. 1.

Figure 11:
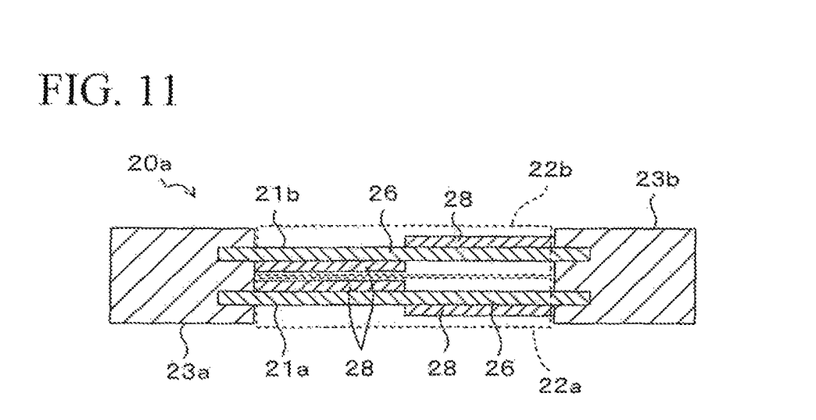
FIG. 11 is a schematic view illustrating a power generation device according to a second embodiment.

(Second Embodiment) FIG. 11 is a schematic view illustrating a power generation device according to a second embodiment.

The second embodiment differs from the first embodiment in that the stress relaxation layers are made of a magnetostrictive material having a polarity opposite to that of the magnetostrictive material of the beams. The other structure of the second embodiment is basically the same as that of the first embodiment. Herein, illustration and description of the part overlapping the first embodiment are omitted.

A power generation device 20a according to the second embodiment includes joint members 23a and 23b and beams 21a and 21b. Each of the beams 21a and 21b includes: a beam body 26; and stress relaxation layers 28 which partially cover the surface of the beam body 26. The beams 21a and 21b are wound with coils 22a and 22b, respectively.

In a similar manner to the first embodiment, the beam bodies 26 are made of a Fe—Ga alloy, a Fe—Co alloy, a Fe—Co amorphous material, a Fe-based amorphous material, or a Ni-based amorphous material, for example.

On the other hand, the stress relaxation layers 28 are made of metal having a magnetostrictive characteristic of a polarity opposite to that of the magnetostrictive characteristic of the beam body 26. The metal having a magnetostrictive characteristic of a polarity opposite to that of the magnetostrictive characteristic of the beam bodies 26 is Sm—Fe, Mg—Cu, Co—Fe—Sm—Dy, Co—Si—B, or the like, for example.

In the power generation device 20a according to the second embodiment, the stress relaxation layers 28 are made of metal having a magnetostrictive characteristic of a polarity opposite to that of the magnetostrictive characteristic of the beam bodies 26. When the beams 21a and 21b are bent as illustrated in FIG. 7, for example, the beam bodies 26 are subjected to tensile stress, and the stress relaxation layers 28 are subjected to compressive stress. In this case, since the magnetostrictive characteristic of the beam bodies 26 is opposite to that of the stress relaxation layers 28, the magnetic flux density of the beam bodies 26 changes in the same direction as the magnetic flux density of the stress relaxation layers 28 changes. Accordingly, large electric current flows in the coils 22a and 22b wound around the beams 21a and 21b, and it may be possible to extract large power from the power generation device 20a.

(Third Embodiment) FIGS. 12A to 12D are schematic views illustrating power generation devices according to a third embodiment. In FIGS. 12A to 12D, the same components as those in FIG. 6 are given the same numerals, and the detailed description thereof is omitted.

Figure 12A:
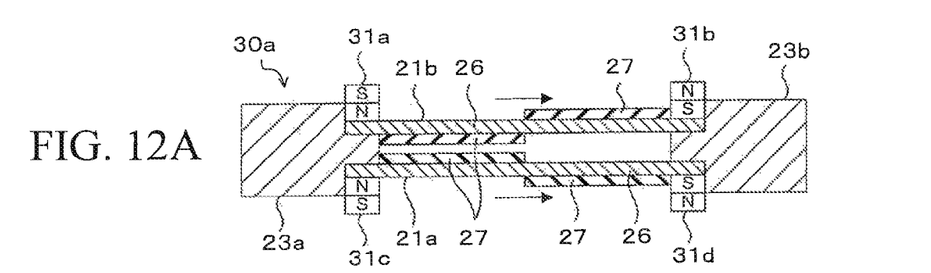
FIGS. 12A to 12D are schematic views illustrating power generation devices according to a third embodiment.

In a power generation device 30a illustrated in FIG. 12A, the end of the beam 21b on the joint yoke 23a side is connected to the north pole of a magnet 31a, and the end of the beam 21b on the joint yoke 23b side is connected to the south pole of a magnet 31b. The end of the beam 21a on the joint yoke 23a side is connected to the north pole of a magnet 31c, and the end of the beam 21a on the joint yoke 23b side is connected to the south pole of a magnet 31d.

By these magnets 31a to 31d, flux paths are formed in the beams 21a and 21b in the direction from the joint yoke 23a to the joint yoke 23b. Each of the beams 21a and 21b includes: a beam body 26 made of a magnetostrictive material in a similar manner to the first embodiment; and stress relaxation layers 27 partially covering the beam body 26. The beams 21a and 21b are wound with respective coils (not illustrated).

Figure 12B:
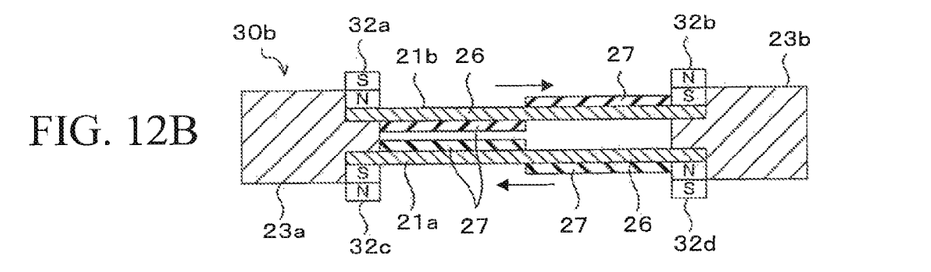

In the power generation device 30b illustrated in FIG. 12B, the end of the beam 21b on the joint yoke 23a side is connected to the north pole of a magnet 32a, and the end of the beam 21b on the joint yoke 23b side is connected to the south pole of a magnet 32b. The end of the beam 21a on the joint yoke 23a side is connected to the south pole of a magnet 32c, and the end of the beam 21a on the joint yoke 23b side is connected to the north pole of a magnet 32d.

By these magnets 32a to 32d, a flux path is formed from the end of the beam 21b on the joint yoke 23a side to the end thereof on the joint yoke 23b side, and a flux path is formed from the end of the beam 21a on the joint yoke 23b side to the end thereof on the joint yoke 23a side. Each of the beams 21a and 21b includes: a beam body 26 made of a magnetostrictive material in a similar manner to the first embodiment; and stress relaxation layers 27 partially covering the beam body 26. The beams 21a and 21b are wound with respective coils (not illustrated).

Figure 12C:
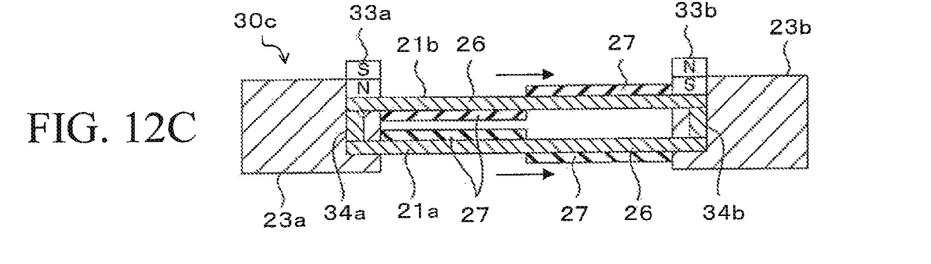

In a power generation device 30c illustrated in FIG. 12C, the end of the beam 21b on the joint yoke 23a side is connected to the north pole of a magnet 33a, and the end of the beam 21b on the joint yoke 23b side is connected to the south pole of a magnet 33b. The ends of the beams 21a and 21b on the joint yoke 23a side are magnetically connected by a magnetic member 34a, and the ends of the beams 21a and 21b on the joint yoke 23b side are magnetically connected by a magnetic member 34b.

By these magnets 33a and 33b and magnetic members 34a and 34b, flux paths are formed in the beams 21a and 21b in the direction from the joint yoke 23a to the joint yoke 23b. Each of the beams 21a and 21b includes: a beam body 26 made of a magnetostrictive material in a similar manner to the first embodiment; and stress relaxation layers 27 partially covering the beam body 26. The beams 21a and 21b are wound with respective coils (not illustrated).

Figure 12D:
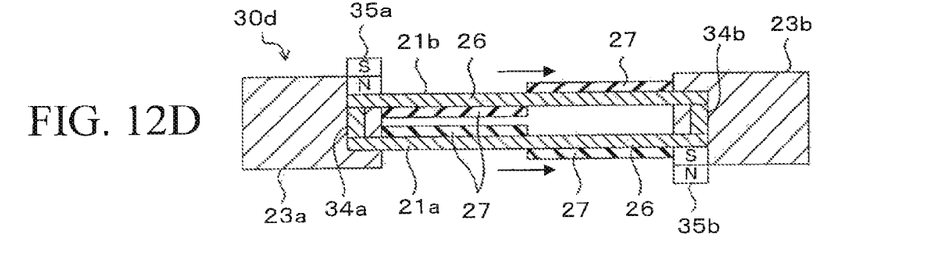

In a power generation device 30d illustrated in FIG. 12D, the end of the beam 21b on the joint yoke 23a side is connected to the north pole of a magnet 35a, and the end of the beam 21a on the joint yoke 23b side is connected to the south pole of a magnet 35b. The ends of the beams 21a and 21b on the joint yoke 23a side are magnetically connected by a magnetic member 34a, and the ends of the beams 21a and 21b on the joint yoke 23b side are magnetically connected by a magnetic member 34b.

By these magnets 35a and 35b and magnetic members 34a and 34b, flux paths are formed in the beams 21a and 21b in the direction from the joint yoke 23a to the joint yoke 23b. Each of the beams 21a and 21b includes: a beam body 26 made of a magnetostrictive material in a similar manner to the first embodiment; and stress relaxation layers 27 partially covering the beam body 26. The beams 21a and 21b are wound with respective coils (not illustrated).

In the power generation devices 30a to 30d described above, similarly to the first embodiment, tensile or compressive stress develops substantially throughout the beam bodies 26, which are made of a magnetostrictive material, in the thickness and length directions. Accordingly, the power generation device 30a to 30d generates power with high efficiency.

Figure 13A:
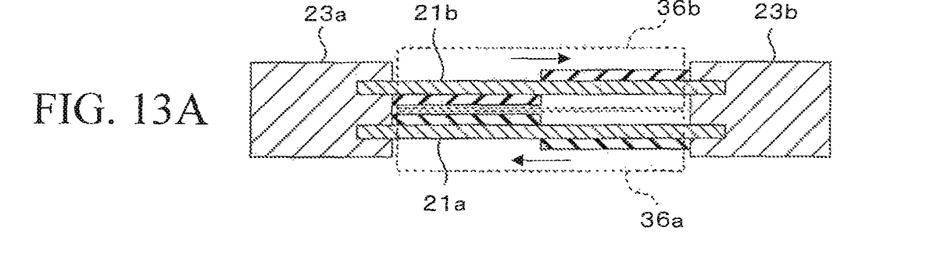
FIGS. 13A and 13B are views illustrating the ways in which the coils are wound.
Figure 13B:
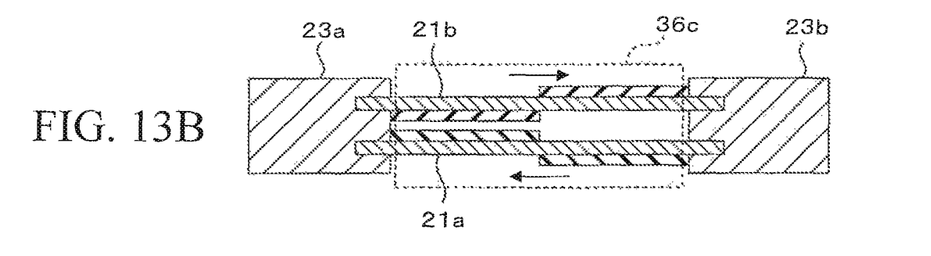

When the direction of the magnetic flux passing through the beam 21a is different from the direction of the magnetic flux passing through the beam 21b as illustrated in FIG. 12B, the beams 21a and 21b may be wound with coils 36a and 36b, respectively, as illustrated in FIG. 13A or may be wound with a coil 36c together as illustrated in FIG. 13B.

By winding the beams 21a and 21b together with the coil 36c as illustrated in FIG. 13B, the number of parts may be reduced, and the product cost may be therefore reduced. Moreover, the space between the beams 21a and 21b may be made narrow, thus implementing miniaturization of the power generation device.

Figure 14:
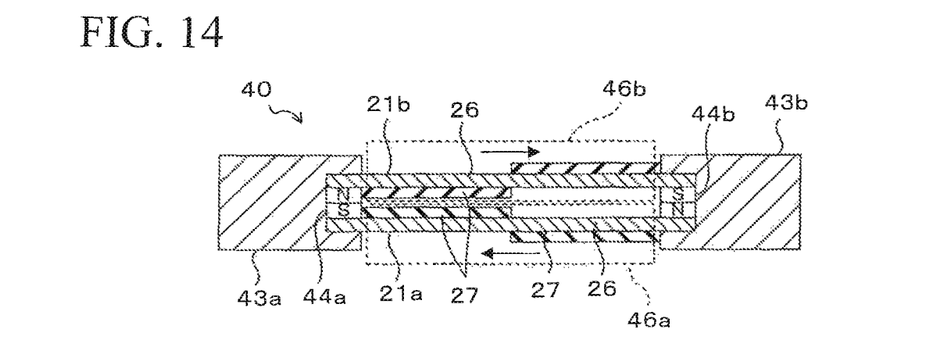
FIG. 14 is a schematic cross-sectional view illustrating a power generation device according to a fourth embodiment.

(Fourth Embodiment) FIG. 14 is a schematic cross-sectional view illustrating a power generation device according to a fourth embodiment.

A power generation device 40 illustrated in FIG. 14 includes: beams 21a and 21b, joint yokes 43a and 43b, permanent magnets 44a and 44b, and coils 46a and 46b respectively wound around the beams 21a and 21b. Each of the beams 21a and 21b includes: a beam body 26 made of a magnetostrictive material in a similar manner to the first embodiment; and stress relaxation layers 27 partially covering the beam body 26.

Ends of the beams 21a and 21b are joined by the joint yoke 43a, and the other ends thereof are joined by the joint yoke 43b. Between the ends of the beams 21a and 21b on the joint yoke 43a side, the magnet 44a is provided. The north pole of the magnet 44a is connected to the beam 21b, and the south pole thereof is connected to the beam 21a. Between the ends of the beams 21a and 21b on the joint yoke 43b side, the magnet 44b is provided. The south pole of the magnet 44b is connected to the beam 21b, and the north pole thereof is connected to the beam 21a.

By these magnets 44a and 44b, a loop flux path sequentially passing through the beam 21b, magnet 44b, beam 21a, and magnet 44a is formed. The beams 21a and 21b are respectively wound with the coils 46a and 46b in the fourth embodiment but may be wound with a coil together as illustrated in FIG. 13B.

In the fourth embodiment, the north and south poles of the magnet 44a are magnetically connected to the south and north poles of the magnet 44b through the beams 21a and 21b. Accordingly, the back yoke is not provided, and the beams 21a and 21b are not prevented by the back yoke from bending. The power generation device 40 according to the fourth embodiment therefore has a power generation efficiency further increased.

Figure 15:
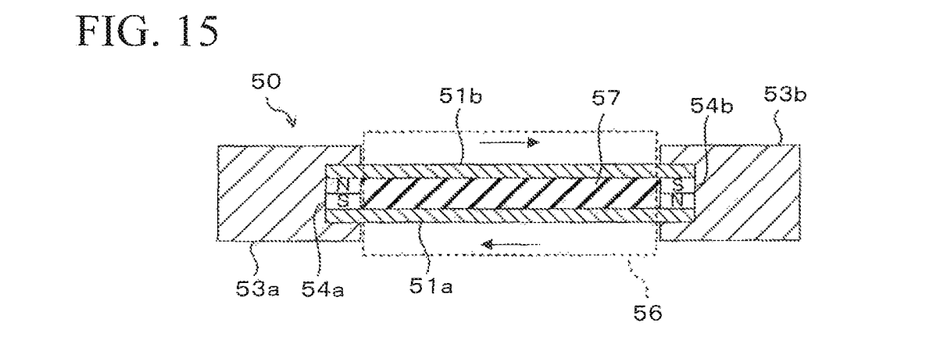
FIG. 15 is a schematic cross-sectional view illustrating a power generation device according to a fifth embodiment.

(Fifth Embodiment) FIG. 15 is a schematic cross-sectional view illustrating a power generation device according to a fifth embodiment.

A power generation device 50 according to the fifth embodiment includes beams 51a and 51b, a coil 56, joint yokes 53a and 53b, permanent magnets 54a and 54b, and a stress relaxation layer 57.

Each of the beams 51a and 51b is a long and thin plate made of a magnetostrictive material. These beams 51a and 51b face each other. Between the beams 51a and 51b, a stress relaxation layer 57 made of a non-magnetic material is provided so as to fill the gap between the beams 51a and 51b. Moreover, ends of the beams 51a and 51b on one side are joined to the joint yoke 53a, and the other ends thereof are joined to the joint yoke 53b.

The magnet 54a is provided between the ends of the beams 51a and 51b on the joint yoke 53a side. The north pole of the magnet 54a is connected to the beam 51b, and the south pole thereof is connected to the beam 51a. The magnet 54b is provided between the ends of the beams 51a and 51b on the joint yoke 53b side. The south pole of the magnet 54b is connected to the beam 51b, and the north pole thereof is connected to the beam 51a.

By these magnets 54a and 54b, a flux path is formed from the end of the beam 51b on the joint yoke 53a side to the end thereof on the joint yoke 53b, and a flux path is formed from the end of the beam 51a on the joint yoke 53b side to the end thereof on the joint yoke 53a side. The beams 51a and 51b are wound with the coil 56.

In the fifth embodiment, the stress relaxation layer 57 is provided between the beams 51a and 51b so as to fill the gap therebetween. Accordingly, when vibration is applied, one of the beams 51a and 51b is subjected to compressive stress while the other is subjected to tensile stress. Accordingly, the power generation device according to the fifth embodiment also generates power with high efficiency.

Figure 16:
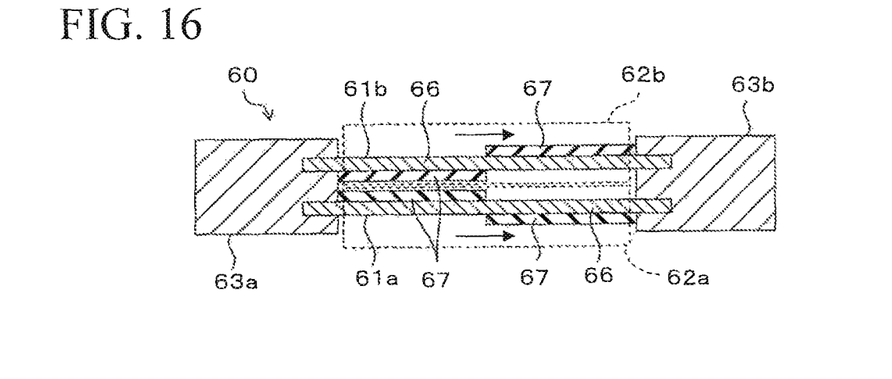
FIG. 16 is a schematic cross-sectional view illustrating a power generation device according to a sixth embodiment.

(Sixth Embodiment) FIG. 16 is a schematic cross-sectional view illustrating a power generation device according to a sixth embodiment.

A power generation device 60 according to the sixth embodiment includes beams 61a and 61b, joint yokes 63a and 63b, and coils 62a and 62b respectively wound around the beams 61a and 61b.

Each of the beams 61a and 61b includes: a beam body 66 made of a metamagnetic shape-memory alloy or a ferromagnetic shape-memory alloy having spontaneous magnetism; and stress relaxation layers 67 partially covering the surface of the beam body 66.

The metamagnetic shape-memory alloy is Ni—Co—Mn—In alloy, Ni—Mn—In alloy, or the like, for example. The ferromagnetic shape-memory alloy is Ni—Mn—Ga alloy, Ni—Mn—Al alloy, Ni—Mn—In alloy, Ni—Mn—Sb alloy, Ni—Mn—Sn alloy, Co—Ni—Ga alloy, Co—Ni—Al alloy, Ni—Fe—Al alloy, Ni—Fe—Ga alloy, Cu—Mn—Ga alloy, Fe—Pt alloy, Fe—Pd alloy, or the like, for example.

When vibration is applied to the power generation device 60, the beams 61a and 61b bend to form strains, and the magnetic force in the beam bodies 66 changes. Electric current thereby flows through the coils 62a and 62b, and electric power may be extracted from the coils 62a and 62b.

In the sixth embodiment, the stress relaxation layers 67 are provided to partially cover the beams 61a and 61b in a similar manner to the first embodiment. Accordingly, the power generation device 60 generates power with high efficiency, and it may be possible to extract large power from the same. Moreover, according to the sixth embodiment, magnets are not separately prepared, and the power generation device may be miniaturized.

Figure 17:
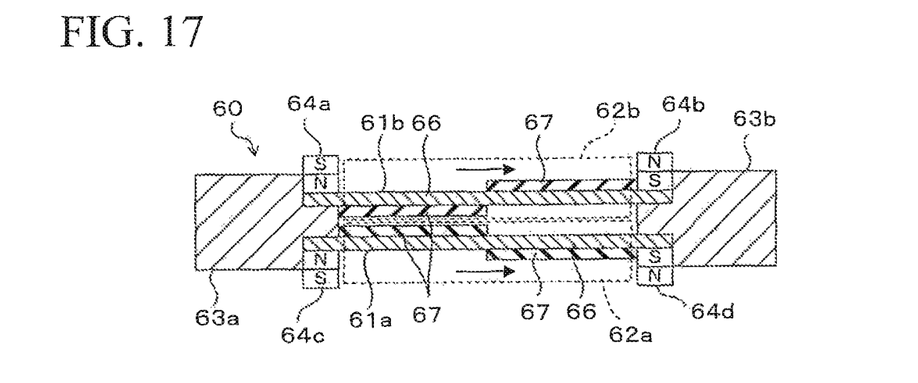
FIG. 17 is a view illustrating a modification of the sixth embodiment.

As illustrated in FIG. 17, magnets 64a to 64d may be attached to the ends of the beams 61a and 61b. This prevents miniaturization of the power generation device but may increase the change in magnetic force, so that the power generation efficiency may be higher than that of the power generation device 60 illustrated in FIG. 16.

Figure 18:
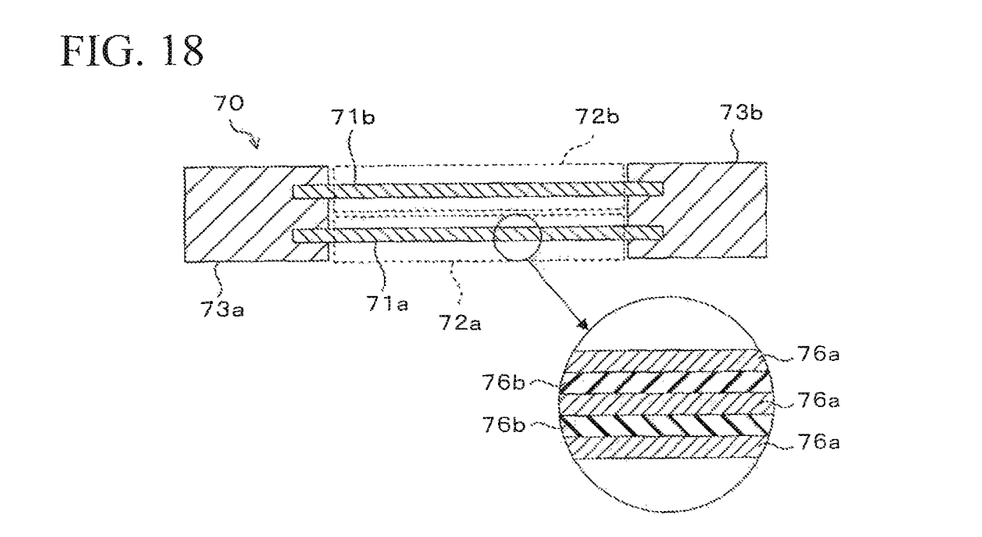
FIG. 18 is a schematic cross-sectional view illustrating a power generation device according to a seventh embodiment.

(Seventh Embodiment) FIG. 18 is a schematic cross-sectional view illustrating a power generation device according to a seventh embodiment.

A power generation device 70 according to the seventh embodiment includes beams 71a and 71b, joint yokes 73a and 73b, and coils 72a and 72b respectively wound around the beams 71a and 71b. The power generation device 70 according to the seventh embodiment includes magnets and a back yoke, which are not illustrated in FIG. 18, in a similar manner to the power generation device 10 illustrated in FIG. 1, for example.

Each of the beams 71a and 71b has a structure in which magnetostrictive layers 76a and insulating layers 76b are alternately stacked on each other. The magnetostrictive layers 76a are made of a magnetostrictive material such as Fe-based amorphous material metglas (2605SA1, Fe—B—Si, or the like) by Hitachi Metals, Ltd. with a thickness of 25 µm, for example. The insulating layers 76b are made of an insulating material, such as epoxy or cyanoacrylate, with a thickness of 2 µm, for example. The total number of the magnetostrictive and insulating layers 76a and 76b is 20 to 30, for example.

In the seventh embodiment, each of the beams 71a and 71b has a layered structure of the magnetostrictive and insulating layers 76a and 76b. This may reduce generation of eddy currents in the magnetostrictive layers 76a when the beams 71a and 71b are bent. The power generation device 70 therefore generates power with high efficiency.

Figure 19:
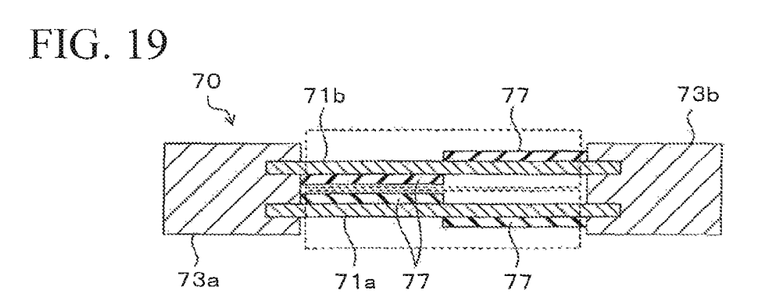
FIG. 19 is a view illustrating a modification of the seventh embodiment.

Moreover, stress relaxation layers 77 are formed on the surfaces of the beams 71a and 71b as illustrated in FIG. 19. This may further increase the power generation efficiency of the power generation device 70.

(Other Embodiments) In the above description, each embodiment includes two beams. However, the number of beams is not limited to two as illustrated in FIGS. 20A and 20B, for example.

Figure 20A:
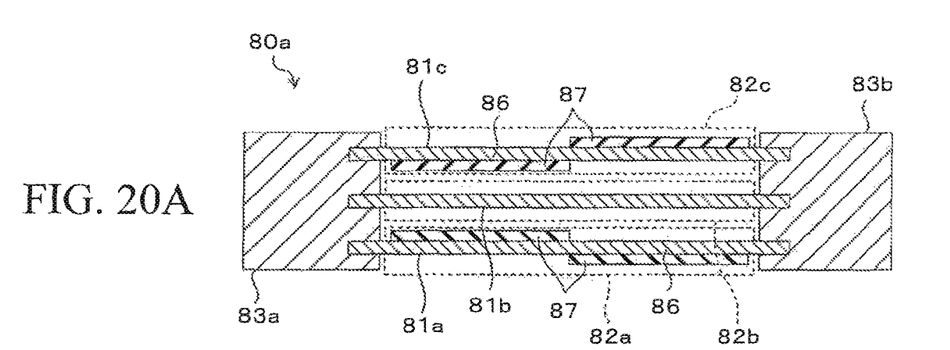
FIGS. 20A and 20B are schematic cross-sectional views illustrating other embodiments.

A power generation device 80a illustrated in FIG. 20A includes three beams 81a, 81b, and 81c between joint yokes 83a and 83b. The beams 81a, 81b, and 81c are wound with coils 82a, 82b, and 83c, respectively.

The beam 81b provided at the center is made of a magnetostrictive material. Each of the beams 81a and 81c provided to sandwich the beam 81b includes: a beam body 86 made of a magnetostrictive material; and stress relaxation layers 87 partially covering the surface of the beam body 86.

Figure 20B:
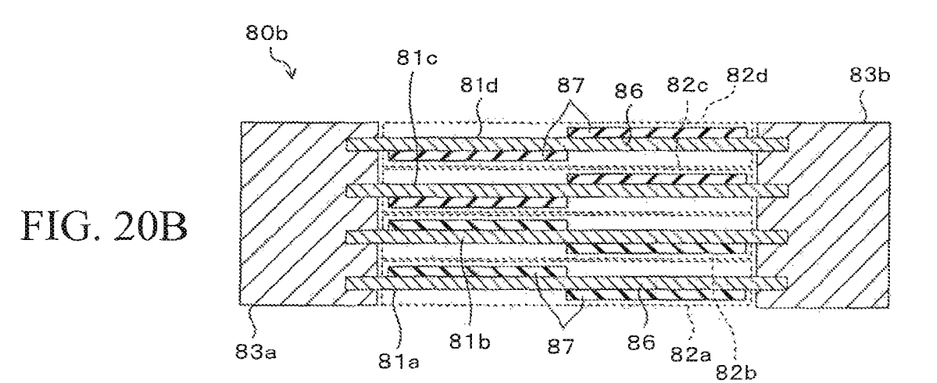

A power generation device 80b illustrated in FIG. 20B includes four beams 81a to 81d between the joint yokes 83a and 83b. The beams 81a to 81d are wound with coils 82a to 82d, respectively.

Each of the beams 81a to 81d includes: a beam body 86 made of a magnetostrictive material; and stress relaxation layers 87 partially covering the surface of the beam body 86.

These power generation devices 80a and 80b generate power with high efficiency in a similar manner to the first embodiment and may provide large power with small vibration.

The power generation devices of the aforementioned embodiments may be used as power sources for supplying driving power to electronic equipment and may be also used as sensors detecting vibration.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power generation device, comprising:
   first and second beams which are arranged to face each other and are bent by vibration;
   a first joint yoke joining one end of the first beam to one end of the second beam;
   a second joint yoke joining another end of the first beam to another end of the second beam; and
   a coil wound around the first and second beams, wherein
   each of the first and second beams includes: a beam body formed into a plate; and a stress relaxation layer made of a material different from a material of the beam body and partially covering the surface of the beam body, and
   one end of the beam body is joined to the first joint yoke, another end of the beam body is joined to the second joint yoke, and a whole of the beam body is made of a single material.

2. The power generation device according to claim 1, wherein the beam body is made of a magnetostrictive material.

3. The power generation device according to claim 2, wherein the stress relaxation layers are made of a magnetostrictive material having a polarity opposite to the magnetostrictive material of the beam bodies.

4. The power generation device according to claim 1, wherein the beam body is made of any one of a metamagnetic shape-memory alloy and a ferromagnetic shape-memory alloy.

5. The power generation device according to claim 1, wherein the stress relaxation layers are provided on only facing surfaces of the first and second beams on one end side and are provided on only surfaces of the first and second beams opposite to the facing surfaces on an opposite end side.

6. The power generation device according to claim 5, wherein the stress relaxation layers are thicker on the end sides of the first and second beams than on a center side of the first and second beams.

7. The power generation device according to claim 1, wherein the stress relaxation layers are made of an insulating material.

8. The power generation device according to claim 7, wherein the stress relaxation layers are made of any one of silicon oxide, alumina, polyimide, polycarbonate, and fiber-reinforced plastic.

9. The power generation device according to claim 1, wherein the stress relaxation layers are made of a non-magnetic metal.

10. The power generation device according to claim 1, wherein magnets are provided between the ends of the first and second beams.

11. The power generation device according to claim 10, wherein the first and second beams and the magnets form a loop flux path.

12. The power generation device according to claim 1, wherein a direction of magnetic flux passing through the first beam is different from a direction of magnetic flux passing through the second beam.

13. The power generation device according to claim 12, wherein the coil is wound around the first and second beams together.

14. A power generation device, comprising:
    first and second beams which are disposed to face each other and are bent by vibration;
    a first joint yoke joining one end of the first beam to one end of the second beam;
    a second joint yoke joining another end of the first beam to another end of the second beam; and
    a coil wound around the first and second beams, wherein
    at least one of the first and second beams has a structure in which layers made of a magnetostrictive material and layers made of an insulating material are alternately stacked on each other,
    one end of the layer made of the magnetostrictive material is joined to the first joint yoke, and another end of the layer made of the magnetostrictive material is joined to the second joint yoke, and
    one end of the layer made of the insulating material is joined to the first joint yoke, and another end of the layer made of the insulating material is joined to the second joint yoke.

15. The power generation device according to claim 14, wherein a thickness of each of the layers made of the magnetostrictive material is larger than a thickness of each of the layers made of the insulating material.

16. The power generation device according to claim 14, further comprising a stress relaxation layer which partially covers the surface of each of the first and second beams.

* * * * *